US007203409B2

(12) United States Patent
Merritt et al.

(10) Patent No.: US 7,203,409 B2
(45) Date of Patent: Apr. 10, 2007

(54) SUPERLUMINESCENT DIODES HAVING HIGH OUTPUT POWER AND REDUCED INTERNAL REFLECTIONS

(75) Inventors: Scott A. Merritt, McLean, VA (US); Peter J. S. Heim, Washington, DC (US)

(73) Assignee: Covega Corporation, Jessup, MD (US)

(*) Notice: Subject to any disclaimer, the term of this patent is extended or adjusted under 35 U.S.C. 154(b) by 20 days.

(21) Appl. No.: 10/919,112

(22) Filed: Aug. 16, 2004

(65) Prior Publication Data

US 2006/0034576 A1    Feb. 16, 2006

(51) Int. Cl.
*G02B 6/10* (2006.01)
*H01S 5/00* (2006.01)
(52) U.S. Cl. .................. 385/129; 385/132; 372/43.01; 372/46.01
(58) Field of Classification Search .................. 372/3, 372/20, 32, 46, 98, 102, 10, 43.01, 46.01, 372/96; 385/37, 47, 46, 129–132, 12, 310.33, 385/14, 43
See application file for complete search history.

(56) References Cited

U.S. PATENT DOCUMENTS

| 5,252,839 | A |   | 10/1993 | Fouquet |       |
|-----------|---|---|---------|---------|-------|
| 5,978,400 | A | * | 11/1999 | Campbell et al. | 372/46.01 |
| 6,091,755 | A | * | 7/2000  | Sanders et al. | 372/92 |
| 6,430,207 | B1 | * | 8/2002 | Alphonse | 372/98 |
| 6,775,439 | B2 | * | 8/2004 | Takano et al. | 385/47 |
| 6,856,712 | B2 | * | 2/2005 | Fauver et al. | 385/12 |
| 6,937,780 | B2 | * | 8/2005 | Alphonse | 385/14 |
| 6,999,485 | B2 | * | 2/2006 | Takagi | 372/29.02 |
| 7,046,435 | B2 | * | 5/2006 | Shin et al. | 359/344 |
| 2003/0141511 | A1 | * | 7/2003 | Marsh et al. | 257/98 |
| 2003/0165296 | A1 | * | 9/2003 | Bouda | 385/43 |

FOREIGN PATENT DOCUMENTS

EP    0895326    * 2/1999

OTHER PUBLICATIONS

Lin et al, "Superluminescent Diodes with Bent Waveguide" IEEE Photonics Technology Letters, vol. 8 No. 2, Dated Feb. 1996.*
Semenov, A. T., et al., "Wide Spectrum Single Quantum Well Superluminescent Diodes at 0.8 µm With Bent Optical Waveguide", Electronic Letters, May 13, 1993, vol. 29, No. 10, pp. 854-856.
Song, J.H., et al., High-Power Broad-Band Superluminescent Diode With Low Spectral Modulation at 1.5-µm Wavelength, IEEE Photonics Technology Letters, Jul. 2000, vol. 12, No. 7, pp. 783-785.

* cited by examiner

*Primary Examiner*—Hemang Sanghavi
(74) *Attorney, Agent, or Firm*—Potomac Patent Group PLLC

(57) ABSTRACT

Systems and methods according to the present invention address this need and others by providing SLD devices and methods for generating optical energy that reduce internal reflections without the use of an absorber region. This can be accomplished by, among other things, adapting the waveguide geometry to dump reflections from the front facet out through the back facet of the device.

20 Claims, 6 Drawing Sheets

SUPERLUMINESCENT DIODES HAVING HIGH OUTPUT POWER AND REDUCED INTERNAL REFLECTIONS

BACKGROUND

The present invention relates generally to optical light sources and, more particularly, to super luminescent diodes (SLDs) having reduced internal reflectivity.

Optical technologies associated with sensing, instrumentation, and communication have evolved significantly over the last several decades. For example, over the last two decades optical communication technologies have transitioned from laboratory curiosities to mainstream products which are the fundamental means for high speed/high bandwidth communications, advanced sensors, and high precision instruments. Various light sources can be used in these diverse applications. Lasers, for example, can be used to generate constant wave (CW) or pulsed optical signals suitable for use in communication devices. Incas/IMP quantum well lasers with suitable guiding and gain regions can be driven to generate optical pulses for transmitting data in fiber optic communication networks. The optical output of a laser, however, may not be suitable for all optical applications. Low coherence interferometry and coherence domain reflectometry are examples of optical applications in which it is preferable to use light sources having a high power output over a much broader bandwidth than is generally available using lasers.

Super luminescent diodes (SLDs), like lasers, use stimulated emission as a primary mechanism for generating light, but are not intended to exceed the threshold for laser oscillation. Even though lasing is not intended in SLDs, various internal reflections occur within conventional SLDs which may result in spectral output variations which are undesirable in a number of applications, including those mentioned above, and which may (under adverse conditions) result in lasing. To better understand these undesirable reflections, consider the exemplary SLD device 10 illustrated in FIGS. 1(a)–(b).

Therein, a generalized, side section of an SLD device 10 is shown in FIG. 1(a) including a contact region 12, a first cladding layer 14, an active region 16 which establishes a vertical waveguide and a second cladding layer 18. Waveguide 16 confines the optical energy to the active region 16 in the vertical dimension in FIG. 1(a). Pumping current I is injected into the contact region 12 to pump active region 16 to generate light via spontaneous emission. Active region 16 can, for example, be fabricated as a multiple quantum well structure (e.g., alternating layers of GaInAs or GaInAsP) or a bulk active region (e.g., GaInAsP or AlInGaAs). The active region can also contain additional layers (e.g. GaInAsP or AlInGaAs) to form a separate confinement heterostructure (SCH) to tailor the optical waveguide properties of active region 16. First and second cladding layers 14 and 18, which can be fabricated from IMP, operate to contain carriers vertically within the active region due to their higher bandgaps. Light generated within the waveguide created by the layers 14–18 is output via a front facet 20 in the direction indicated by the output arrow. Typically, the optical output energy would be coupled to, e.g., an optical fiber (not shown) to be guided to another device.

Reflections can occur when light generated by injection luminescence strikes an interface between the front facet 20 of the SLD 10 and the outside environment (e.g., air). At normal incidence to the facet, the magnitude of the reflected optical energy will primarily depend upon the phase index n of waveguide 16 of the SLD device 10 relative to the phase index of the ambient. Taking for example the ambient to be air ($n_1 = n_{p, air@STP@589nm} = 1.00029$) and the SLED waveguide index to be $n_2 = n_{p, SLED} = 3.2$, a typical value for the amount of power reflected at the normal incidence facet is approximately 27% ($R = (n2-n1)^2/(n2+n1)^2$). These reflections, symbolized by the arrow $R_{FF}$ in FIG. 1(a), will travel back along the waveguide created by layers 14–18 to the back facet 22 of the SLD, where they will again be reflected as indicated by the arrow $R_{BF}$. These reflections may themselves be captured by the waveguide and transmitted as an unintended double-pass amplified output of SLD 10. This results in various undesirable effects including, for example, the possibility that downstream devices will treat the reflections as optical "echoes" of the power that is intentionally transmitted by the SLD 10. Another undesirable effect which may occur, particularly at high output powers, is that the reflections which are being generated back and forth between the front facet 20 and back facet 22 may result in a spectral modulation or "ripple" on the optical energy output from SLD 10. This spectral ripple causes ghosting in low coherence interferometry applications, makes it difficult to provide power control over the optical power generated by SLD 10 and, in many cases, renders the SLD useless if the magnitude of the spectral ripple is too high. Many applications, for example, require the peak-to-peak spectral ripple to be less than 0.5 dB. The mean reflectivity at each facet (R) required for a SLD with internal single pass gain (G) to obtain a desired spectral ripple ($\Delta G$) is given by $R = G^{-1}(\Delta G - 1)/(\Delta G + 1)$. This means that for a high-power SLD, which can have a single-pass optical gain of 30 dB or more, the mean power reflected at each facet must be less than 0.006%. The need for this extremely low facet reflectivity represents one of the major challenges in producing high-performance, high-power SLDs.

Various techniques have been employed in an attempt to reduce internal reflections in SLDs. One technique, seen in the FIG. 1(a) is to apply antireflective (AR) coatings 24 and 26 to the front facet 20 and back facet 22, respectively. However, AR coatings providing less than 0.1% power reflectivity are extremely difficult to manufacture. AR coatings are also not broadband, i.e. they exhibit a wavelength dependent reflectance spectrum. Thus, while applying an AR coating can be effective within a certain narrow bandwidth, it may not be a viable solution for SLDs that generate wider bandwidth spectra.

Another technique, described in an article by A. T. Seminov, V. R. Shidlovski and S. A. Safin, entitled "Wide spectrum single quantum well superluminesent diodes at 0.8 um with bent optical waveguide", Electron. Lett, vol. 29, pp. 854–857, 1993), is to provide an angle θ at the interface between the lateral waveguide 17 and the front facet 20. This technique is, for example, illustrated in FIG. 1(b) which figure is a top sectional view taken along section line A—A in FIG. 1(a). As used throughout this specification, such "angles" are referenced with respect to facet normal. The vertical waveguide 16 and lateral waveguide 17 form a 2-dimensional waveguide with a defined optical mode that propagates along the length of the chip. As one skilled in the art is aware, the lateral waveguide 17 can be formed by various means for example a ridge waveguide or a buried waveguide. Although the angled facet can reduce the reflections that propagate back through the waveguide to the back facet 22, and has the advantage that the effective facet reflectivity is inherently broadband, nonetheless some reflections will still occur. The amount of reflection can be further reduced by using a combination of AR coatings and angled facet, as shown in FIG. 1(b). Yet even with this combination it can be difficult to obtain the required low facet reflectivity for high-power, high-performance broadband SLDs.

Another mechanism that has been proposed for dealing with internal reflections is to dump the rearward traveling reflections into an absorbing region 17 indicated in FIG. 1(b). The absorbing region 17 is formed by not injecting current along the entire length of the active waveguide 16, thereby creating an unpumped section 13 indicated in FIGS. 1(a) and 1(b). Since this section is not pumped, it absorbs light rather than emits light thereby attenuating the rearward traveling reflections and preventing them from reaching the back facet 22. The main disadvantage of this approach is that it results in a longer chip which translates directly into higher production cost. This is particularly the case for quantum-well active regions which have a small confinement factor and are readily "bleached" at high optical power. As shown in the article by Song, J. H. et al., entitled "High-power broad-band super luminescent diode with low spectral modulation at 1.5-μm wavelength", Photonics Technology Letters, IEEE, Volume: 12, Issue: 7, Jul. 2000, Pages: 783–785, good spectral ripple can be obtained using an absorber, but at the expense of more than doubling the chip length.

To reduce the length of the absorbing region, it has also been proposed to provide an active (reverse biased) absorption region to absorb reflections in the region proximate the back facet 22, as shown in the side view in FIG. 2(a) (wherein the reference numerals are reused from FIG. 1(a) to denote similar structures). Therein, a second contact region 24 is placed over the portion of the SLD 26 proximate the back facet 22. The contact region 22 is separated from the contact region 12 to create an absorption region and a gain region, respectively, within the SLD 26. The contact region 22 is reverse biased relative to the contact region 12 using a voltage $V_B$. This has the effect of biasing the absorber region which increases the amount of absorption and also increases the upper wavelength at which absorption occurs above that of the emission wavelengths of the gain region, thereby acting to further absorb reflections traveling along the waveguide/active region 16. However, this solution suffers from the potential drawback that the interface between the absorber region and the gain region will itself cause reflections. Also, a second electrode that requires a separate bias voltage introduces additional complexity that increases the overall cost of operating the SLD. An example of a reverse-biased absorption region can be found in U.S. Pat. No. 5,252,839, the disclosure of which is incorporate here by reference.

Yet another approach to reduce facet reflections is to fabricate so-called "window" sections adjacent to the facets. Using exemplary window sections 28 and 29 in FIG. 2(a), the optical mode is no longer confined and is allowed to freely diffract such that reflections from the facet do not couple as efficiently back into the waveguide as compared to SLDs wherein the waveguide extends all the way to the facet. However, these window regions are of limited utility because they cannot be made too long otherwise the freely diffracting beam can no longer be captured effectively with practical optical elements. Also, the window regions require complicated wafer fabrication processes to selectively remove the active region and replace it with epitaxial regrowth of the upper cladding material. The incremental reduction in facet reflectivity achieved with window structures often does not warrant the added fabrication complexity and associated yield loss/cost increase.

Accordingly, it would be desirable to provide SLD techniques and devices that provide high power and high quality output optical energy by reducing internal reflections.

SUMMARY

Systems and methods according to the present invention address this need and others by providing SLD devices and methods for generating optical energy that reduce internal reflections without the use of an absorber region. This can be accomplished by, among other things, adapting the waveguide geometry to dump reflections from the front facet out through the back facet of the device.

According to one exemplary embodiment of the present invention, an optical light source includes a substrate having a front facet and a back facet, a gain section extending over a portion of the substrate proximate the front facet; and a waveguide extending from the front facet, through the gain section, to the back facet, wherein the waveguide interfaces with the front facet at a first angle and the waveguide interfaces with the back facet at a second angle, and further wherein a radius of curvature at substantially each point along the waveguide is greater than a predetermined minimum radius of curvature. Among other things, providing for a minimum radius of curvature prevents excessive losses of the guided mode to radiative slab modes within the laser crystal.

According to another exemplary embodiment of the present invention, an optical light source includes a substrate having a front facet and a back facet, a gain section within the substrate which extends across substantially all of the substrate, a contact region on top of the substrate which extends across substantially all of the substrate, and a waveguide extending from the front facet, through the gain section, to the back facet, wherein the waveguide has a geometry which reduces spectral ripple in an output of the optical light source.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Although it is desirable to minimize all internal reflections within an SLD device, of particular interest are so-called two-pass reflections. Two-pass reflections occur when optical energy is reflected from the front facet, makes a first pass through the gain section of an SLD wherein it is amplified once, is reflected from the back facet, and makes a second pass through the gain section prior to exiting the SLD device through the front facet. Two-pass reflections are particularly undesirable since they can have such large amplitudes due to experiencing, e.g., 40 dB, of gain from having passed through the device two times.

Figure 3A:
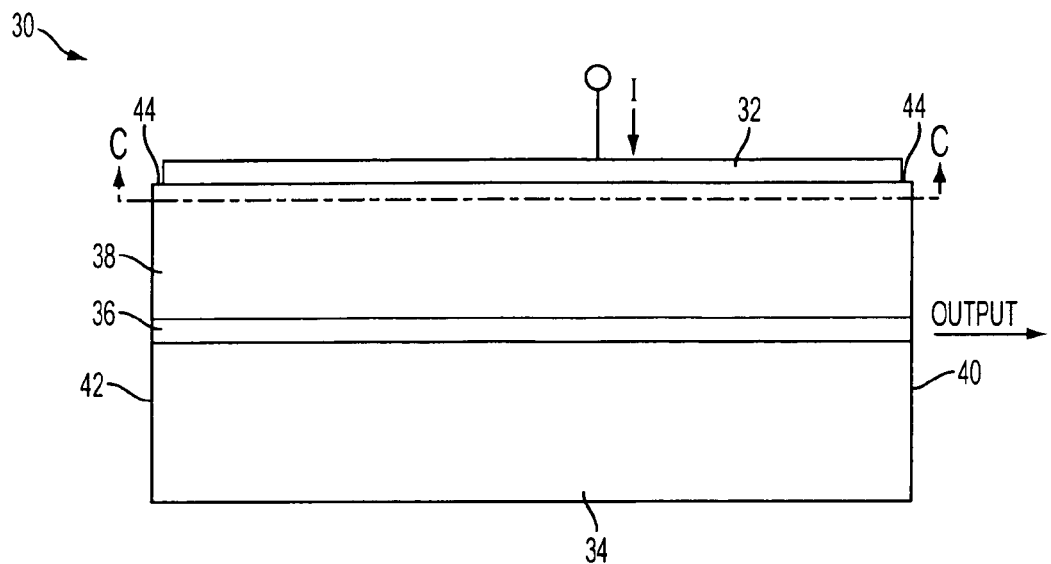
FIG. 3(a) depicts a generalized side sectional view of an SLD device according to an exemplary embodiment of the present invention.
Figure 3B:
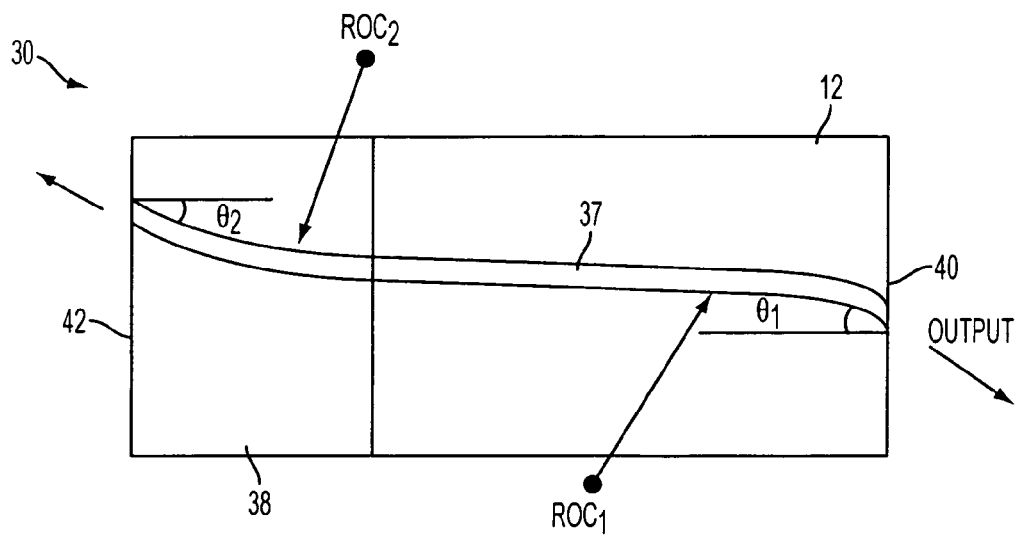
FIG. 3(b) is a top section view taken along section lines C—C of the SLD device of FIG. 3(a)

These, and other, drawbacks associated with SLDs are overcome according to exemplary embodiments of the present invention in which SLD devices and methods are provided which dump reflected optical energy without using an absorber region. An exemplary embodiment of the present invention is illustrated in FIGS. 3($a$) and 3($b$). Therein, an exemplary device 30 has a vertical active waveguide 36 and curved lateral waveguide 37 that intersects the output or primary emission facet 40 at an angle $\theta_1$ of, for example, 8 degrees. This angle reduces the modal reflectance by approximately $10^{-4}$ for the mode field diameters obtained with exemplary ridge waveguides of 3.6 microns width and etch depths consistent with single mode operation at the mean emission wavelength of the active region. Mean wavelengths of 1310 and 1550 nm can be used since they are commonly employed due to their biological and telecommuninications and sensing relevance, however those skilled in the art will appreciate that any mean wavelength can be used that is compatible with semiconductor laser technology (~0.3–10 μm). Angles for $\theta_1$ less than about 8 degrees may provide too large a modal reflectance and angles greater than about 8 degrees may cause the beam exit angle, which is determined from Snell's law, to be excessive. Large beam exit angles complicate the design of the lens (not shown) positioned proximate the output region of the device to couple the output beam to a collection lens, subsequent lenses, and output fibers.

According to one exemplary embodiment of the present invention, the rear facet (dump port) angle $\theta_2$ can be 13 degrees or about 13 degrees. This angle should be larger than the waveguide-facet angle $\theta_1$ of the output facet since it should have a lower modal reflectance. The angle $\theta_2$ should not be much larger than 13 degrees, otherwise all or some of the mode propagating inside the waveguide 37 will be subject to total internal reflection (TIR). TIR will prevent efficient dumping of the undesired rear facet power and raises the risk that some energy will either be recaptured by the waveguide 37 and directed to the front facet 40 or will propagate to the front facet in slab waveguide modes or other modes within the device 30.

Thus, a value for $\theta_1$ can be selected which provides a compromise between minimizing internal reflections from the front facet 40 and avoiding mechanical interference with other optics, e.g., 5–10 degrees. By way of contrast, the angle $\theta_2$ provided between the waveguide 37 and the back facet 42 can have a value that is intended primarily to minimize reflections and, therefore, will be larger than the value of $\theta_1$. According to one exemplary embodiment, $\theta_1$ equals 8 degrees and $\theta_2$ equals 13 degrees, however those skilled in the art will appreciate that different angle values can be used (generally, $\theta_2 > \theta_1 \geq 5$ degrees). In this way, optical energy which is reflected from the front facet 40, and which is also captured by waveguide 37, will be dumped from the back facet 42 in the general direction of the arrow in FIG. 3($b$) referring to exiting optical energy. Little, if any, energy is reflected from the back facet 42 and propagated back through the device 30 as a two-pass reflection. Some exemplary test results that show how well SLD devices according to the present invention reduce internal reflections are provided below.

The epitaxial layer structure employed for SLDs typically involves high gain material with, for example, a gain coefficient of approximately 30 cm$^{-1}$ and long chips (1 to 2 mm). An exemplary embodiment of the present invention therefore contains three, four or more quantum wells with four being exemplary. The SCH structure should be chosen to capture carriers efficiently so they can be transported into the quantum wells. The SCH region and quantum well stack together and constitute the "active region" described below.

Figure 1A:
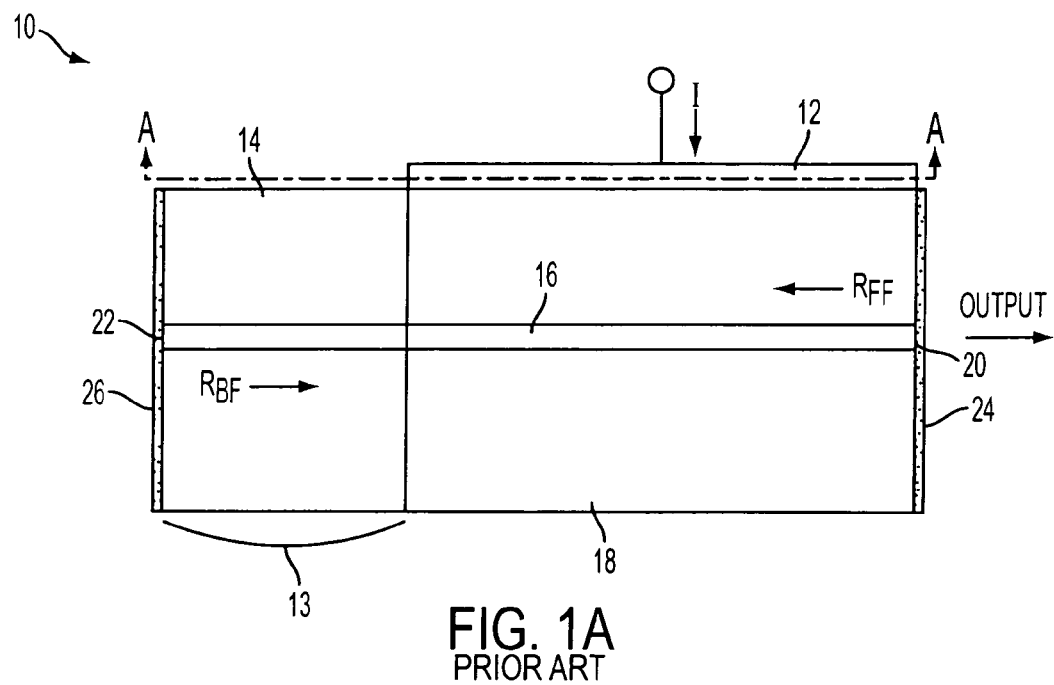
FIG. 1(a) depicts a generalized side sectional view of a conventional SLD device.
Figure 1B:
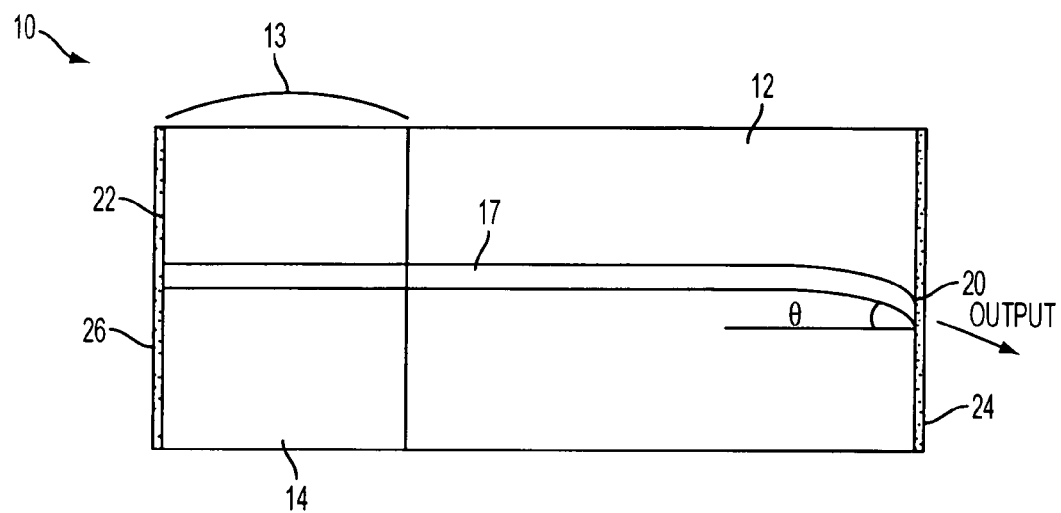
FIG. 1(b) is a top sectional view taken along section lines A—A of the conventional SLD of FIG. 1(a)
Figure 2A:
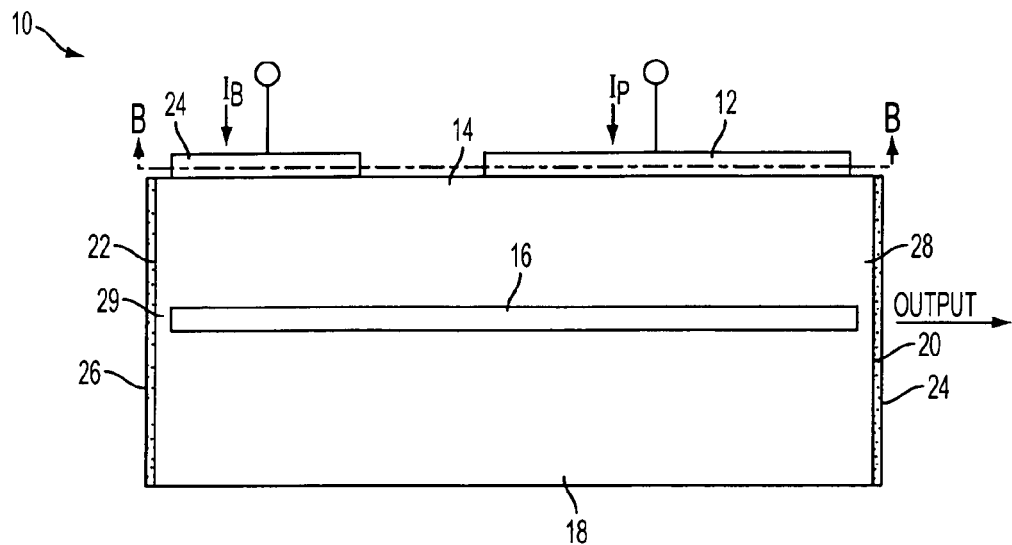
FIG. 2(a) depicts a generalized side sectional view of another conventional SLD device.
Figure 2B:
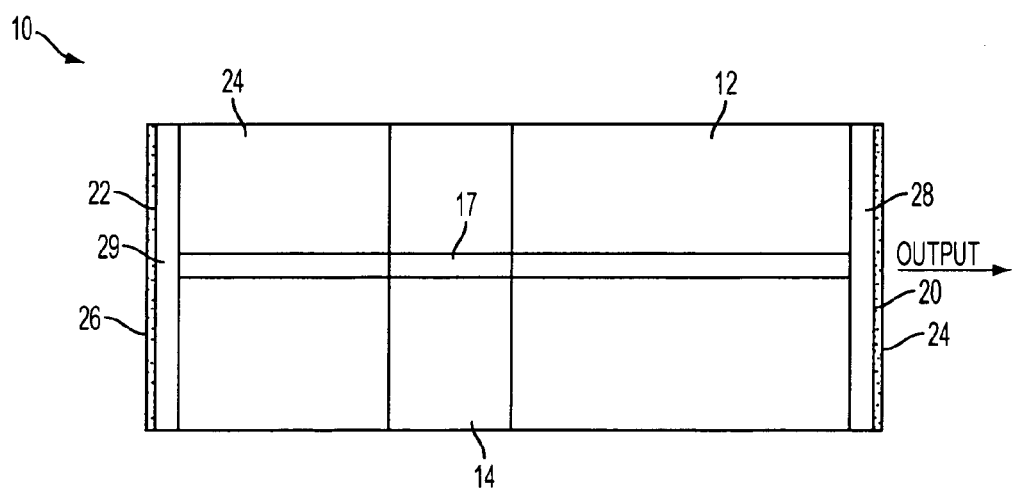
FIG. 2(b) is a top sectional view taken along section lines B—B of the conventional SLD device of FIG. 2(a)

Referring again to FIGS. 3($a$) and 3($b$), the generalized, side section of an SLD device 30 according to an exemplary embodiment of the present invention further includes a contact region 32, a first cladding layer 34, an active region that acts as a vertical waveguide 36 and a second cladding layer 38. Pumping current I is injected into the contact region 32 to pump active region 36 to generate light via spontaneous emission. Active region 36 can, for example, be fabricated either as an SCH region and a multiple quantum well structure (e.g., alternating layers of GaInAs or GaInAsP) or as a bulk active region. First and second cladding layers 34 and 38, which can be fabricated from IMP, operate to contain carriers within the active region due to their higher bandgap energy. Light generated within the waveguide created by the layers 34–38 is output via a front facet 40 in the general direction indicated by the output arrow. Typically, the optical output energy would be coupled to, e.g., an optical fiber (not shown) to be guided to another device. Unlike the SLD device of FIGS. 2($a$) and ($b$), the waveguide 36 extends across the entire substrate of SLD device 30, i.e., from the front facet 40 of the SLD device 30 through the gain section to the back facet 42. AR coatings can also be applied to front facet 40 and rear facet 42 of SLD device 30 to further reduce reflections.

In addition to providing (different) angled interfaces at both the front and back facets to dump light reflected from the front facet 40 and minimize (or eliminate) captured reflections from the back facet 42, SLD devices according to exemplary embodiments of the present invention also have minimum radius of curvature properties. More specifically, lateral waveguide 37 can be designed to, at all or substantially all points along the length of the substrate, have a minimum radius of curvature that is greater than a predetermined minimum value. In the example of FIGS. 3($a$)–($b$), this is illustrated by forming the waveguide 37 as two curves concatenated together, the first curve having a radius of curvature of $R_{OC1}$ and the second curve having a radius of curvature of $R_{OC2}$. $R_{OC1}$ and $R_{OC2}$ can be selected in order to provide the desired interface angles $\theta_1$ and $\theta_2$, while at the same time adhering to a minimum radius curvature constraint.

Maintaining a waveguide having a continuous and gradual curvature enables SLD devices according to exemplary embodiments of the present invention to minimize losses of modal energy since modal energy losses are a function of the radius of curvature of the waveguide. This provides design control over optical energy generated within the SLD device 30, both in the forward path for energy directed out through the front facet 40 and in the rearward path for reflections directed out through the back facet 42. Regarding this latter point, losses which can be created by less gradual curvature in waveguide 37 occur when the modal energy confined by waveguide 37 leaves the waveguide and becomes non-modal optical energy. This non-modal optical energy may then be reflected from the back facet 42 and be recaptured by the waveguide 37. Accordingly, exemplary embodiments of the present invention seek to contain the modal energy reflected from the front facet 40 in order to dump a greater portion of that energy out through the back facet 42.

Figure 4:
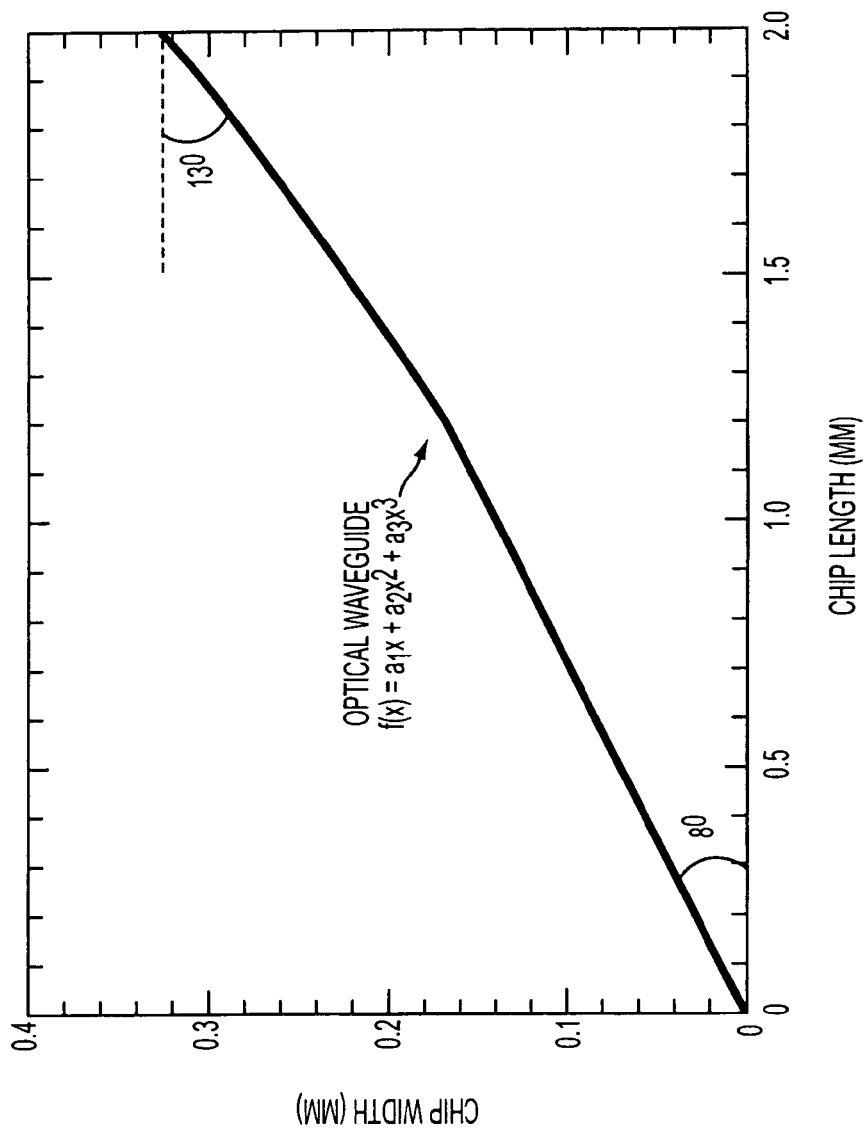
FIG. 4 shows a waveguide geometry for an SLD device according to an exemplary embodiment of the present invention.

According to exemplary embodiments, the minimum radius of curvature will be on the order of several times the length of the substrate. According to one exemplary embodiment, the length of the substrate is 2 mm and the minimum radius of curvature is 9 mm, such that both $R_{OC1}$ and $R_{OC2}$ are greater than or equal to 9 mm. Although this exemplary embodiment of the present invention includes a waveguide 37 formed from two curves, i.e., having two radii of curvature, the present invention is not so limited. SLD devices according to the present invention can include curved waveguides having more than two radii of curvature. In fact, the radius of curvature may itself change along the length of the waveguide 37. According to one exemplary embodiment of the present invention, the waveguide geometry can be determined using a third order polynomial $y(x)=a_1 x + a_2 x^2 + a_3 x^3$ and solving for $a_1$, $a_2$, and $a_3$. The three unknown values $a_1$, $a_2$, and $a_3$ can be determined by setting up and solving three nonlinear simultaneous equations using three constraints. The constraints are the two values for the interface angles $\theta_1$ and $\theta_2$ and a minimum radius of curvature $ROC_{min}$ at the rear (dump) facet. The ROC over the entire waveguide is then plotted to ensure that the minimum ROC is exceeded over the entire chip length. This prevents spurious solutions which may have unacceptably small ROCs in the middle of the waveguide or at the front (output) facet. According to one purely illustrative exemplary embodiment, this technique was used with $\theta_1$ equal to 8 degrees, $\theta_2$ equal to 13 degrees and $ROC_{min}$ equal to 9 mm for a 2 mm substrate. This resulted in values of 0.141, −0.014 and 0.013 for $a_1$, $a_2$, and $a_3$, respectively, with the resulting waveguide geometry being shown in FIG. 4 as a function of the substrate width and length in millimeters.

Figure 5A:
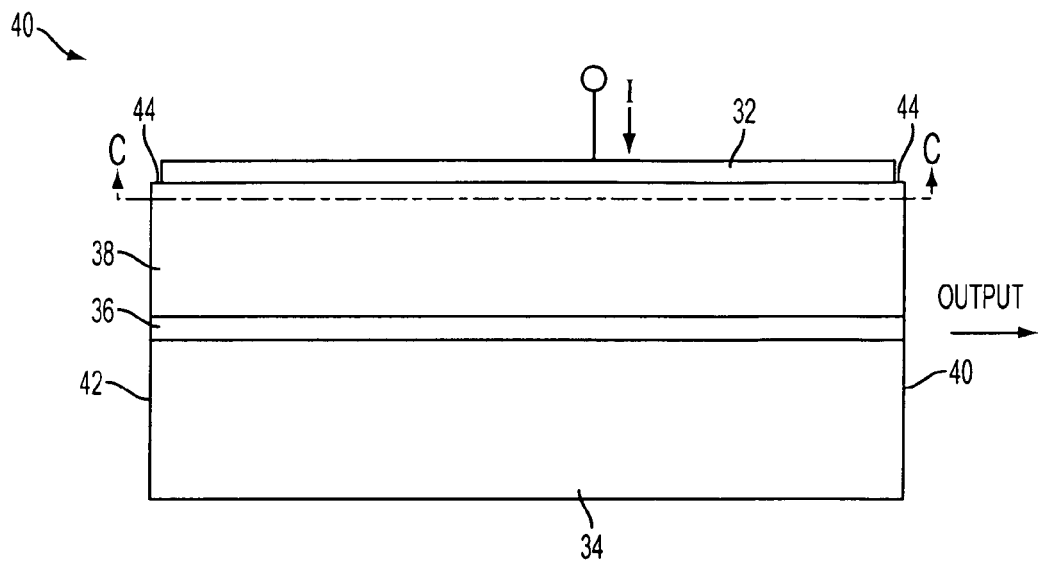
FIGS. 5(a) and 5(b) depict a generalized side sectional view and top section view, respectively, for an SLD device according to another exemplary embodiment of the present invention.
Figure 5B:
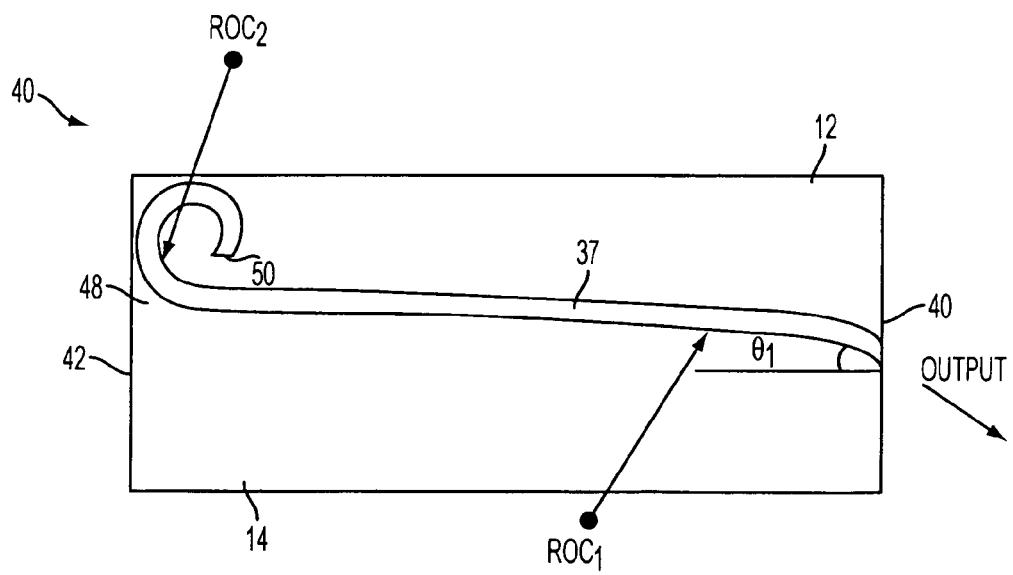

According to another exemplary embodiment of the present invention, shown in FIG. 5 (a) and FIG. 5(b), the ROC of the SLD device 40 can be chosen to vary along the length of the waveguide 37 such that the minimum ROC is not exceeded over portions of the waveguide proximate to the back facet 42. The radius of curvature in the region proximate to the back facet, ROC2, can be chosen to be small enough that optical energy radiates out of the lateral waveguide 37 as the optical mode traverses the bend. This creates, for example, a helical shape to the waveguide 37 toward the back portion of the device. The radius of curvature can be selected so that substantially most of the optical energy in waveguide 37 leaks out of the waveguide into region 48 prior to intercepting the back facet 42. The optical energy that leaks out of the waveguide is incident on the back facet at an angle and is dumped out the back facet. There is no actual waveguide at the back facet reducing the amount of reflection that couples back into waveguide 37 from reflected optical energy at back facet 47. The tail end 50 of waveguide 37 is oriented so that any modal optical energy in waveguide 37 that reaches the end of the waveguide propagates toward the back facet 47 rather than the front facet 40. Anti-reflection coating can be applied to both front facet 40 and back facet 47 to further reduce reflections.

As mentioned above, SLD devices according to exemplary embodiments of the present invention are able to reduce internal reflections without using an absorber region. This means that, for example, the SLD device 30 and SLD device 40 can be pumped across its entire length or substantially its entire length. Note in FIG. 3(a) that the contact region 32 extends across substantially the entire length of the substrate. Typically, SLD device 30 will be manufactured by fabricating a large number of such devices on a wafer. Since the contact region 32 is formed of a metallic material, it may be desirable for manufacturing reasons to provide a cleaving setback region 44 at each end of the device 30 that is free from metallic material so that when the wafer is cut into the individual devices, the cutting tool need not cut through metal. Since there is no need for an absorber region in SLD devices according to the present invention, the epitaxial contact cap layer portion (not shown) of the substrate under the cleaving setback regions 44, which is heavily doped to provide pumping energy from the contact region 32 to the ends of the device 32, can be retained. In this case, the cap layer will lie beneath an electrically insulating layer that also covers the noncontacted regions which are beneath the contact metallization. The cleaving setback regions 44 can be quite small, e.g., on the order of 10 microns, depending upon the technique used to cleave the wafer containing the SLD devices according to the present invention. These regions are normally rendered optically transparent by the intensity of the photons in the waveguide even though these regions are not electrically pumped quite as well as the fully contacted regions. Current spreading from the fully contacted regions, as described above, keeps these short uncontacted sections quite transparent optically. Pumping all or nearly all of the length of the chip allows the full gain of the chip to be used to amplify the spontaneous emission which seeds the ASE process. This increases the output power and electrical-to-optical conversion efficiency.

Figure 6A:
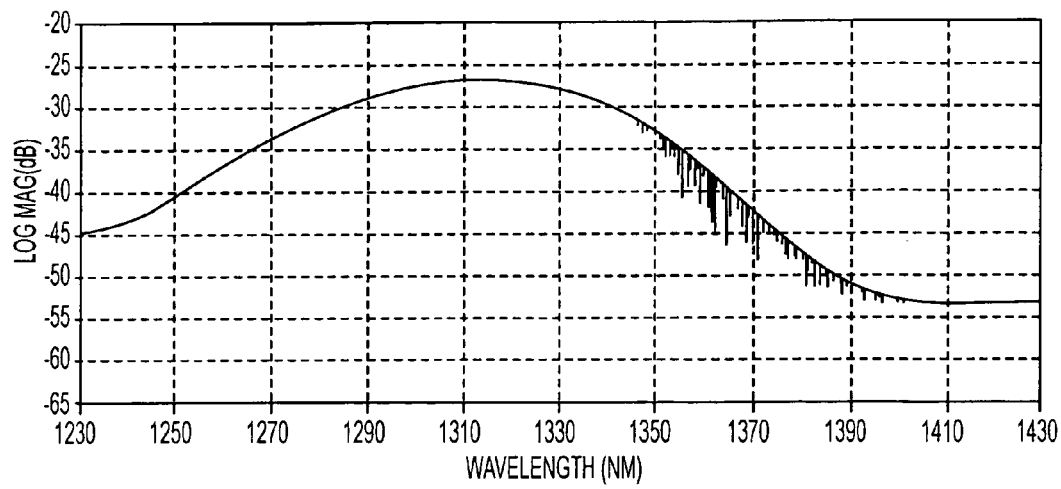
FIGS. 6(a) and 6(b) show power output spectra for an SLD device according to an exemplary embodiment of the present invention.
Figure 6B:
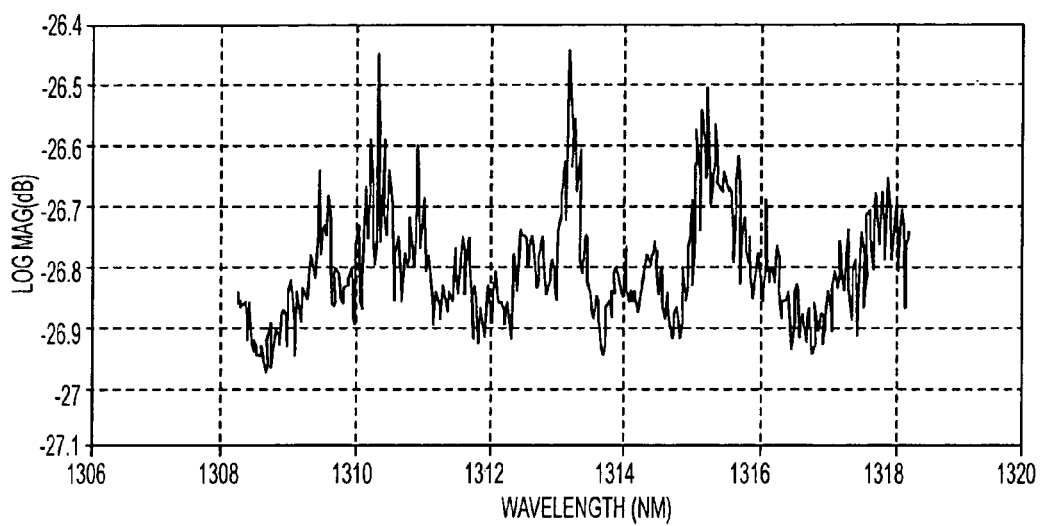

An SLD device according to the present invention and substantially similar to that described above with respect to FIGS. 3(a)–3(b) and 4 has been tested to determine how well internal reflections are reduced by using the afore-described structure. The test results are provided below with respect to FIGS. 6(a) and 6(b). In FIG. 6(a) the amplified spontaneous emission (ASE) power spectra measured from a test device is plotted as a function of wavelength. Note that the power spectra in the peak wavelength range, e.g., approximately 1308–1318 nm, is wide and flat which indicates a lack of ripple which would be created by unwanted internal reflections within the SLD device fabricated in accordance with the present invention. To further illustrate this point, the peak portion of the spectra of FIG. 6(a) is magnified in FIG. 6(b), wherein the actual ripple can be seen and is at least an order of magnitude less than that which would be expected from a conventional SLD device at these power levels (approx 2 mW or greater) and with high resolution optical measurements (with optical filters<0.1 nm or less than the free spectral range of the chip), indicating a significant reduction in internal reflections.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. An optical light source comprising:
   a substrate having a front facet and a back facet;
   a gain section extending over a portion of said substrate proximate said front facet; and
   a waveguide extending from said front facet, through said gain section, to said back facet,
   wherein said waveguide interfaces with said front facet at a first non-zero angle and said waveguide interfaces with said back facet at a second non-zero angle different from said first non-zero angle, and further wherein a radius of curvature at substantially each point along said waveguide is greater than a predetermined minimum radius of curvature;
   further wherein said waveguide has at least two different radii of curvature.

2. The optical light source of claim 1, wherein said optical light source is one of a super luminescent diode and an optical amplifier.

3. The optical light source of claim 1, wherein said substrate has a predetermined length and said predetermined minimum radius of curvature has a value which is at least several times said predetermined length.

4. The optical light source of claim 3, wherein said predetermined length is within a range of 0.5 mm to 4 mm and said predetermined minimum radius of curvature is greater than the chip length.

5. The optical light source of claim 1, wherein said waveguide curves continuously from said front facet to said back facet.

6. The optical light source of claim 1, wherein said optical light source does not include an absorber region.

7. The optical light source of claim 1, wherein said gain section extends over substantially all of said substrate.

8. The optical light source of claim 1, wherein said at least two radii of curvature are calculated as a mathematical function employing, as constraints, said first non-zero angle, said second non-zero angle and said predetermined minimum radius of curvature.

9. An optical light source comprising:
   a substrate having a front facet and a back facet;
   a gain section within said substrate that extends across substantially all of said substrate;
   a contact region on top of said substrate which extends across substantially all of said substrate; and
   a waveguide extending from said front facet, through said gain section, to said back facet and interfacing with said front facet at a first non-zero angle and with said back facet at a second non-zero angle, said first non-zero angle being different than said second non-zero angle,
   wherein said waveguide has at least two different radii of curvature,
   wherein said waveguide has a geometry that reduces spectral ripple in an output of said optical light source.

10. The optical light source of claim 9, wherein a radius of curvature at substantially each point along said waveguide is greater than a predetermined minimum radius of curvature.

11. The optical light source of claim 10, wherein said radius of curvature is calculated as a mathematical function employing, as constraints, said first non-zero angle, said second non-zero angle and said predetermined minimum radius of curvature.

12. The optical light source of claim 9, wherein said substrate has a predetermined length and said predetermined minimum radius of curvature has a value that exceeds said predetermined length.

13. The optical light source of claim 12, wherein said predetermined length is within a range from 0.5 mm to 4 mm and said predetermined minimum radius of curvature is 5 to 9 mm.

14. The optical light source of claim 9, wherein said waveguide curves continuously from said front facet to said back facet.

15. The optical light source of claim 9, wherein said optical light source does not include an absorber region.

16. An optical light source comprising:
   a substrate having a front facet and a back facet;
   a gain section within said substrate that extends across substantially all of said substrate;
   a contact region on top of said substrate which extends across substantially all of said substrate; and
   a waveguide extending from said front facet, through substantially all of said gain section, but not interfacing with said back facet, said waveguide having at least two different radii of curvature,
   wherein said waveguide has a geometry that reduces spectral ripple in an output of said optical light source.

17. The optical light source of claim 16, wherein said waveguide interfaces with said front facet at a first angle and wherein a radius of curvature of said waveguide in the region proximate to said back facet is less than a predetermined radius of curvature.

18. The optical light source of claim 17, wherein said substrate has a predetermined length and said predetermined radius of curvature has a value that is equal to or less than said predetermined length.

19. The optical light source of claim 18, wherein said predetermined length is within a range from 0.5 mm to 4 mm.

20. The optical light source of claim 16, wherein said optical light source does not include an absorber region.

* * * * *